(12) United States Patent
Otsuka

(10) Patent No.: US 10,673,326 B2
(45) Date of Patent: Jun. 2, 2020

(54) SEMICONDUCTOR DEVICE INCLUDING BOOSTING CIRCUIT WITH PLURAL PUMP CIRCUITS

(71) Applicant: LAPIS SEMICONDUCTOR CO., LTD., Kanagawa (JP)

(72) Inventor: Masayuki Otsuka, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/202,006

(22) Filed: Nov. 27, 2018

(65) Prior Publication Data

US 2019/0165673 A1    May 30, 2019

(30) Foreign Application Priority Data

Nov. 27, 2017    (JP) ................................. 2017-227002

(51) Int. Cl.
| | |
|---|---|
| *H01L 23/522* | (2006.01) |
| *H02M 3/07* | (2006.01) |
| *G11C 16/30* | (2006.01) |
| *H01L 27/06* | (2006.01) |
| *G11C 5/14* | (2006.01) |

(52) U.S. Cl.
CPC ............ *H02M 3/073* (2013.01); *G11C 5/145* (2013.01); *G11C 16/30* (2013.01); *H01L 23/5223* (2013.01); *H01L 27/0629* (2013.01); *H02M 2003/075* (2013.01); *H02M 2003/076* (2013.01)

(58) Field of Classification Search
CPC ............ H01L 23/5223; H01L 27/0629; H02M 3/073; H02M 2003/075; H02M 2003/076; G11C 16/30
See application file for complete search history.

(56) References Cited

U.S. PATENT DOCUMENTS

| | | | | |
|---|---|---|---|---|
| 8,729,666 B2* | 5/2014 | Stribley | ................... | H01G 4/08 257/532 |
| 8,952,748 B2* | 2/2015 | Guimaraes | .............. | H01L 28/40 327/554 |
| 2003/0107060 A1* | 6/2003 | Ota | ..................... | H01L 21/8252 257/275 |

FOREIGN PATENT DOCUMENTS

JP        H11-273379 A    10/1999

* cited by examiner

*Primary Examiner* — Dinh T Le
(74) *Attorney, Agent, or Firm* — Volentine, Whitt & Francos, PLLC

(57) ABSTRACT

A semiconductor device including: a semiconductor substrate; at least one circuit block provided on a main surface of the semiconductor substrate and having a predetermined function; a wiring layer including plural metal layers that connect the circuit block; and plural capacitors including a first capacitor connected to the circuit block and that uses the plurality of metal layers, and a second capacitor that uses an active area disposed within the main surface of the semiconductor substrate, wherein at least one of the first capacitor and at least one of the second capacitor are stacked in a stacking direction of layers of the semiconductor.

7 Claims, 7 Drawing Sheets

SEMICONDUCTOR DEVICE INCLUDING BOOSTING CIRCUIT WITH PLURAL PUMP CIRCUITS

CROSS-REFERENCE TO RELATED APPLICATION

This application is based on and claims priority under 35 USC 119 from Japanese Patent Application No. 2017-227002, filed on Nov. 27, 2017, the disclosure of which is incorporated by reference herein.

BACKGROUND

Technical Field

The present disclosure relates to a semiconductor device that includes a boosting circuit which employs a charge pump.

Related Art

A boosting circuit that employs a charge pump is used, for example, in a non-volatile semiconductor storage element such as flash memory or the like. In some cases, this flash memory that is provided with a boosting circuit which employs a charge pump is incorporated into a microprocessor or the like. Various operations such as reading, writing, and deleting are performed in the flash memory. However, typically, power supplies having mutually different voltages are required for each operation. Since a boosting circuit that employs a charge pump may easily generate different voltages, it is often used as a built-in power supply circuit.

Conventionally, Japanese Patent Application Laid-Open (JP-A) No. H11-273379 discloses a power supply circuit that employs a charge pump. The charge pump circuit disclosed in JP-A No. H11-273379 has a configuration in which, in a charge pump circuit having n (wherein n is an integer of 2 or more) number of boosting stages, in which each stage has a switching transistor that outputs an output voltage from a previous stage to a subsequent stage, and a subsequent stage output voltage boosting condenser, one of whose electrodes is connected to the switching transistor. The charge pump circuit further includes a clock signal supply circuit that supplies first clock signals and second clock signals that each respectively have a predetermined phase to another electrode of a gate voltage boosting condenser, one of whose electrodes is connected to a gate of the switching transistor, and to another electrode of the output voltage boosting condenser. The charge pump circuit further includes a clock signal boosting circuit that boosts clock signals from the clock signal supply circuit. The clock signal boosting circuit supplies, to m number (wherein m is an integer) of subsequent-side stages including a final stage out of the n number of boosting stages, the boosted clock signals, and supplies, to (n-m) number of previous-side stages, the clock signals from the clock signal supply circuit.

In conjunction with recent increases in the scale of integration and diversification of function and the like, suppressing increases in the circuit layout scale in a semiconductor device has become an urgent issue. Boosting circuits incorporated in a semiconductor device are no exception to this, and achieving a circuit that only requires a small layout surface area is required. On the other hand, in a boosting circuit that employs a charge pump, a boosting capacitor is an essential part of the configuration, as is also evident from JP-A No. H11-273379. Since the capacitance value of a capacitor that is required in a boosting circuit is comparatively large, inevitably, the layout surface area also increases. In a case in which the output voltage from the boosting circuit is increased, then the proportion of the overall layout of the boosting circuit occupied by the surface area of the boosting capacitor is further increased. Accordingly, reducing the layout surface area of a boosting capacitor is necessary in order to reduce the layout surface area of a boosting circuit that employs a charge pump.

Although reducing the layout surface area of a boosting capacitor is one of the issues described in JP-A No. H11-273379, JP-A No. H11-273379 describes a configuration in which the boosting of a portion of the clock signals is not performed, so that the size of the capacitor charged by those clock signals can be kept. Accordingly, reducing the layout surface area of a boosting capacitor while maintaining the same capacitance value is not the disclosed JP-A No. H11-273379.

SUMMARY

The present disclosure provides a semiconductor device that may reduce a layout surface area.

A first aspect of the present disclosure is a semiconductor device including: a semiconductor substrate; at least one circuit block provided on a main surface of the semiconductor substrate and having a predetermined function; a wiring layer including plural metal layers that connect the circuit block; and plural capacitors including a first capacitor connected to the circuit block and that uses the plurality of metal layers, and a second capacitor that uses an active area disposed within the main surface of the semiconductor substrate, wherein at least one of the first capacitor and at least one of the second capacitor are stacked in a stacking direction of layers of the semiconductor.

According to the above aspects, a semiconductor device of the present disclosure may reduce a layout surface area.

BRIEF DESCRIPTION OF THE DRAWINGS

Exemplary embodiments of the present disclosure will be described in detail based on the following figures, wherein.

DETAILED DESCRIPTION

Hereinafter, exemplary embodiments for implementing the present disclosure will be described in detail with reference to the drawings.

First Exemplary Embodiment

A semiconductor device according to the present exemplary embodiment will now be described with reference to FIG. 1 through FIG. 6. The semiconductor device according to the present exemplary embodiment may be in the form of the single boosting circuit described below, or in the form of a semiconductor integrated circuit in which the boosting circuit described below has been mounted together with circuits having other functions. Hereinafter, a boosting circuit section of the semiconductor device according to the present exemplary embodiment will be described.

Figure 1:
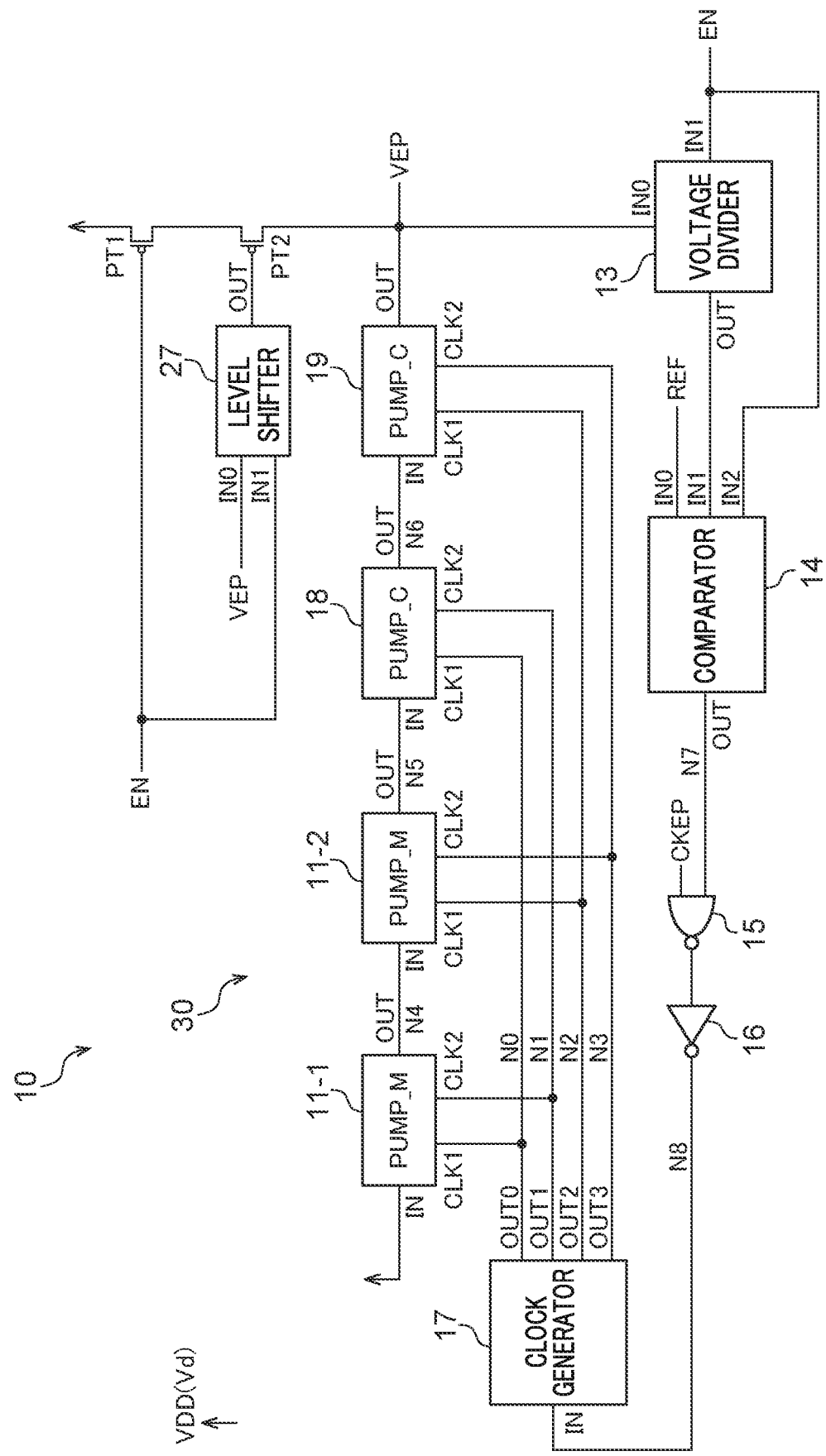
FIG. 1 is a circuit diagram showing a boosting circuit according to a first exemplary embodiment.

As is shown in FIG. 1, a boosting circuit 10 according to the present exemplary embodiment is configured so as to include pump circuits 11-1, 11-2, 18, and 19, a voltage divider 13, a comparator 14, a NAND circuit 15, an inverter 16, a clock generator 17, a level shifter 27, and P-type MOS (Metal Oxide Semiconductor) transistors (hereinafter, referred to as PMOS transistors) PT1 and PT2. A pump section 30 according to the present exemplary embodiment is configured by the pump circuits 11-1, 11-2, 18, and 19.

The boosting circuit 10 is provided with an enable terminal EN, and a clock input terminal CKEP. In the following description, in some cases, a signal input into the enable terminal EN is referred to as 'enable signal en', and a clock signal input into the clock input terminal CKEP is referred to as 'clock signal ckep'. The enable signal en is a control signal that switches the boosting circuit 10 between valid and invalid, and is in the form of a signal (referred to hereinafter as 'H') of a potential Vd of a power supply VDD in a 'boosting circuit operative mode' in which the boosting circuit 10 is made operative, and is in the form of a ground level signal (referred to hereinafter as 'L') in a 'boosting circuit inoperative mode' in which the boosting circuit 10 is made inoperative. In contrast, in the boosting circuit operative mode, the clock signal ckep is input into the clock input terminal CKEP, while in the boosting circuit inoperative mode, L is input into the clock input terminal CKEP.

A reference terminal REF shown in FIG. 1 is an input terminal for a potential forming a reference for a boost potential (i.e., an output potential), and a reference potential Vref is continuously input into this reference terminal REF. An output terminal VEP is a boosting power supply terminal. The output terminal VEP has a higher potential than the power supply potential of the boosting circuit 10 in the boosting circuit operative mode, and has the same as the power supply potential in the boosting circuit inoperative mode. Note that, as is shown in FIG. 1, in the present exemplary embodiment, the high potential side of the boosting circuit 10 is connected to the power supply VDD of the power supply potential Vd.

The pump circuits 11-1, 11-2, 18, and 19 perform successive boosting based on the potential (in the present exemplary embodiment, this is the potential Vd of the power supply VDD) input into the input terminal IN of the pump circuit 11-1, and output a target potential from the output terminal VEP of the boosting circuit 10. The input terminal IN of the pump circuit 11-1 (this is also the input terminal for the pump section 30) is connected to the power supply VDD, while an output terminal OUT thereof is connected to a node N4 to which an input terminal IN of the pump circuit 11-2 is connected. An output terminal OUT of the pump circuit 11-2 is connected to a node N5 to which an input terminal IN of the pump circuit 18 is connected. An output terminal OUT of the pump circuit 18 is connected to a node N6, to which an input terminal IN of the pump circuit 19 is connected. An output terminal OUT of the pump circuit 19 is connected to the output terminal VEP to which a drain terminal of the PMOS transistor PT2, an input terminal IN0 of the voltage divider 13, and an input terminal IN0 of the level shifter 27 are connected.

The voltage divider 13 divides a voltage output to the output terminal VEP, and generates a negative feedback potential. An input terminal IN1 of the voltage divider 13 is connected to the enable terminal EN, to which an input terminal IN2 of the comparator 14, an input terminal IN1 of the level shifter 27, and a gate terminal of the PMOS transistor PT1 are connected. An output terminal OUT of the voltage divider 13 is connected to an input terminal IN1 of the comparator 14.

The comparator 14 compares a potential output from the voltage divider 13 with the reference potential Vref, and outputs a result of this comparison. An input terminal IN0 of the comparator 14 is connected to the reference terminal REF. An output terminal OUT of the comparator 14 is connected to a node N7 to which one input terminal of the NAND circuit 15 is connected. Another input terminal of the NAND circuit 15 is connected to the clock input terminal CKEP. An output terminal of the NAND circuit 15 is connected to an input terminal of the inverter 16. An output terminal of the inverter 16 is connected to a node N8, to which an input terminal IN of the clock generator 17 is connected.

An output terminal OUT of the level shifter 27 is connected to a gate terminal of the PMOS transistor PT2. A source terminal of the PMOS transistor PT2 is connected to a drain terminal of the PMOS transistor PT1. A source terminal of the PMOS transistor PT1 is connected to the power supply VDD.

The clock generator 17 is a circuit that generates the clock signals used by the pump circuits 11-1, 11-2, 18, and 19 based on the clock signal ckep. An output terminal OUT0 of the clock generator 17 is connected to a node N0, to which an input terminal CLK1 of the pump circuit 11-1, and an input terminal CLK1 of the pump circuit 18 are connected. An output terminal OUT1 of the clock generator 17 is connected to a node N1 to which an input terminal CLK2 of the pump circuit 11-1, and an input terminal CLK2 of the pump circuit 18 are connected. An output terminal OUT2 of the clock generator 17 is connected to a node N2 to which an input terminal CLK1 of the pump circuit 11-2, and an input terminal CLK1 of the pump circuit 19 are connected. An output terminal OUT3 of the clock generator 17 is connected to a node N3 to which an input terminal CLK2 of the pump circuit 11-2, and an input terminal CLK2 of the pump circuit 19 are connected. Note that, in the following description, a clock signal output from the output terminal OUT0 is denoted as a 'clock signal clock0', a clock signal output from the output terminal OUT1 is denoted as a 'clock signal clock1', a clock signal output from the output terminal OUT2 is denoted as a 'clock signal clock2', and a clock signal output from the output terminal OUT3 is denoted as a 'clock signal clock3'.

Figure 4:
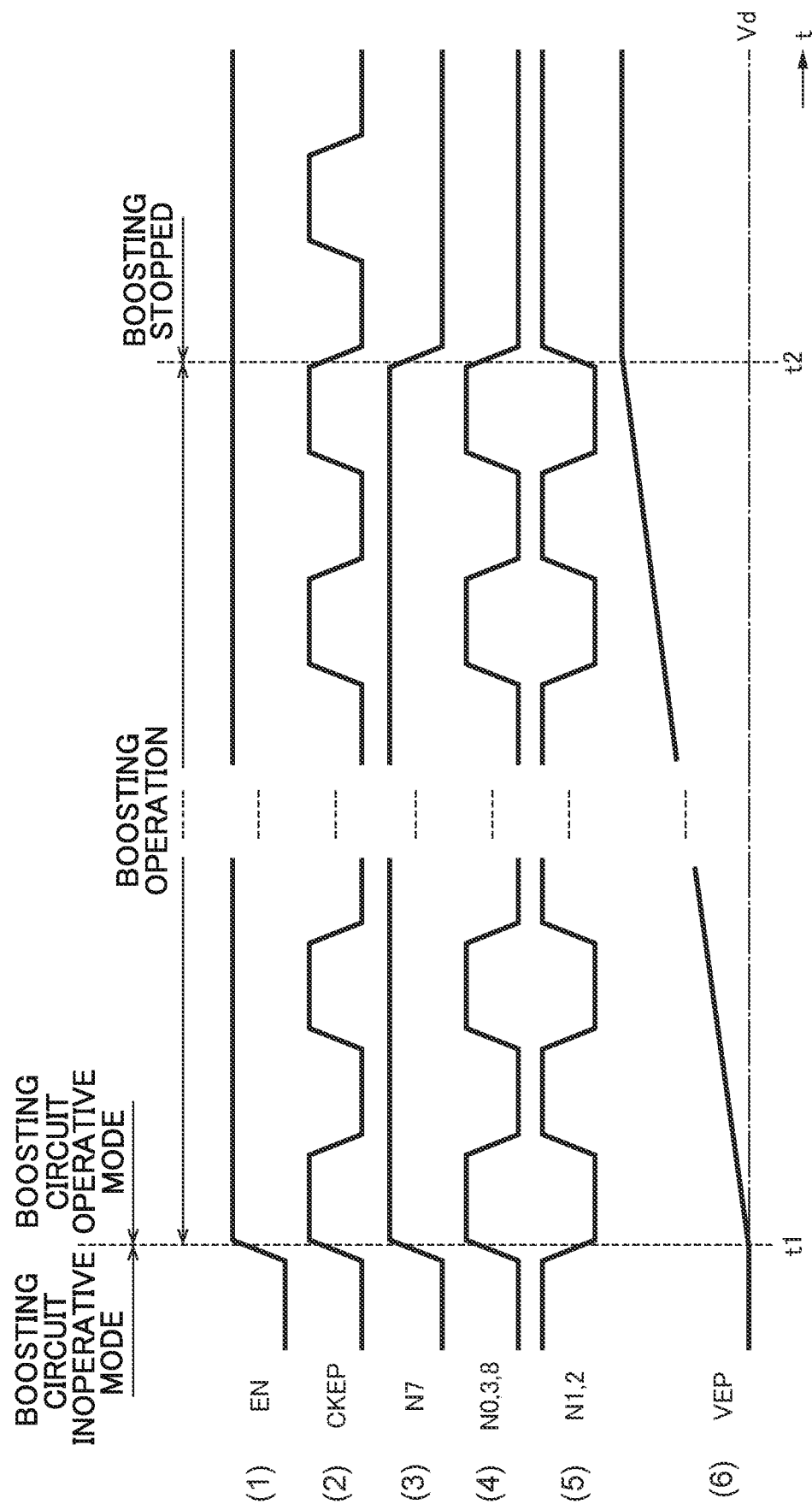
FIG. 4 is a timing chart showing operations of the boosting circuit according to the first exemplary embodiment.

Phase relationships between the clock signals clock0 to clock3 will now be described with reference to FIG. 4. (2) in FIG. 4 shows a waveform of the clock signal ckep, (4) in FIG. 4 shows of a waveform of the clock signals clock0 and clock3 at the nodes N0 and N3, and (5) in FIG. 4 shows a waveform of the clock signals clock1 and clock2 at the nodes N1 and N2. As is shown in FIG. 4, in the present exemplary embodiment, the clock signals clock0 and clock3 are synchronized signals with the clock signal ckep, while the clock signals clock1 and clock2 are inverted signals of the clock signal ckep.

In the boosting circuit inoperative mode, the level shifter 27 fixes the potential of the output terminal VEP to the potential Vd of the power supply VDD. In other words, in the boosting circuit inoperative mode, since the enable signal en is L, the PMOS transistors PT1 and PT2 are ON, and thus, the potential of the output terminal VEP becomes the same as the potential Vd of the power supply VDD. In contrast, in the boosting circuit operative mode, since the enable signal en is H, the PMOS transistors PT1 and PT2 are OFF, and thus, the potential of the output terminal VEP becomes the same as the boosted potential from the pump circuits. In other words, an initial value of the output potential from the boosting circuit 10 is the potential Vd, and the output potential is then successively boosted from this potential Vd.

Next, the pump circuits 11-1, 11-2, 18, and 19 according to the present exemplary embodiment will be described with reference to FIG. 2 and FIG. 3.

Here, based on potentials that are input into the input terminal of the pump section 30, the pump section 30 generates high potential voltages as a result of the pump circuits, which are connected together in series, successively executing operations to further boost a boosted potential that they have received from the previous stage in synchronization with the clock signals. Accordingly, the potential difference applied to the boosting capacitor increases as it approaches closer to the final stage of the pump circuits. On the other hand, generally, the withstand voltage and occupied surface area and the like of a capacitor vary depending on the capacitor type. In other words, it is not essential to use the same type of capacitor for each of the pump circuits configuring the pump section 30.

More specifically, in a case in which a MIM (metal insulator metal) capacitor is compared with a MOS capacitor, there are cases in which the MOS capacitor has a higher withstand voltage than the MIM capacitor. Therefore, in the present exemplary embodiment, the MIM capacitor is used for a boosting capacitor having a predetermined number of pump circuits and including the initial stage of the pump section 30, while the MOS capacitor is used for a boosting capacitor having the remaining pump circuits. Furthermore, in the present exemplary embodiment, in a case in which the MIM capacitor and the MOS capacitor are configured in a semiconductor integrated circuit, these are placed in mutually different layers, and therefore the MIM capacitor and the MOS capacitor are stacked in the vertical direction (i.e., in the stacking direction) in the semiconductor integrated circuit. By employing this configuration, it is possible to greatly reduce the layout surface area of the boosting circuit 10, as well as the layout surface area of a semiconductor device on which the boosting circuit 10 is mounted.

More specifically, in the present exemplary embodiment, a MIM capacitor is used in the pump circuits 11-1 and 11-2 (hereinafter, these may be referred to collectively as a 'pump circuit 11') shown in FIG. 1, and a MOS capacitor is used in the pump circuits 18 and 19. Moreover, in the boosting circuit 10 according to the present exemplary embodiment, an additional circuits are added as an output stage to the pump circuit connected to the output terminal VEP, and the pump circuit 19 corresponds to the output stage pump circuit. Note that, in the present exemplary embodiment, the number of stages of the pump circuit is 4, however, the present disclosure is not limited thereto, and the number of stages may be set to a required number in accordance with the output potential of the boosting circuit 10. Additionally, the apportioning of the number of stages of pump circuits that use MIM capacitors and the number of stages of pump circuits that use MOS capacitors is also not particularly limited, and may be set by taking into consideration the withstand voltage and the output boost potential and the like of each capacitor. For example, a maximum of approximately 11V is sought as the erase potential in flash memory. In a case in which the withstand voltage of the MIM capacitor is 5V, the pump section may be configured using the MIM capacitor in the pump circuit for boosting the potential until approximately 4V, and using the MOS capacitor in the pump circuit for boosting potential in excess of 4V.

Figure 2A:
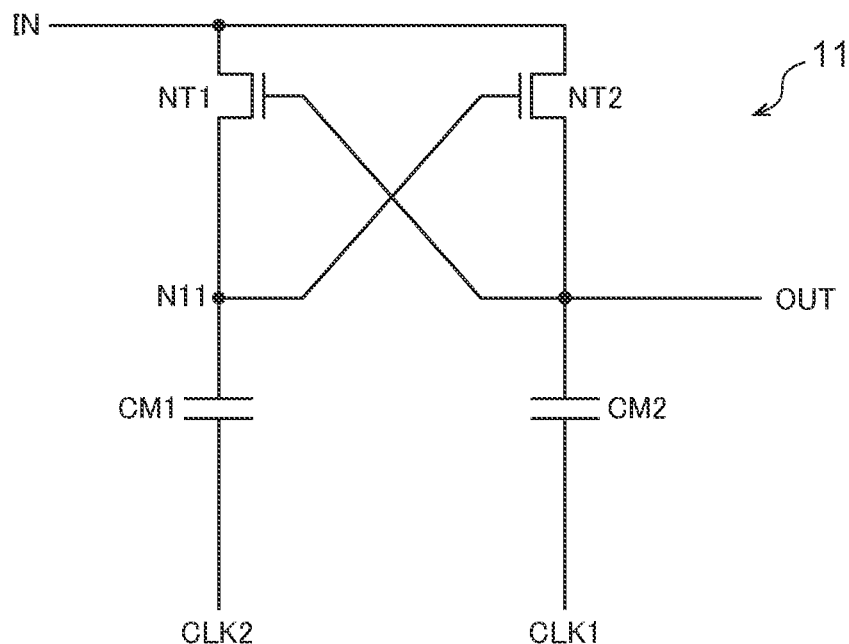
FIG. 2A is a circuit diagram of a pump circuit that uses a MIM capacitor according to the first exemplary embodiment.

As is shown in FIG. 2A, the pump circuit 11 according to the present exemplary embodiment is configured to include N-type MOS transistors (hereinafter, referred to as NMOS transistors) NT1 and NT2, and capacitors CM1 and CM2. The capacitors CM1 and CM2 are MIM capacitors. An input terminal IN, an input terminal CLK1, an input terminal CLK2, and an output terminal OUT respectively correspond to the input terminal IN, the input terminal CLK1, the input terminal CLK2, and the output terminal OUT of the pump circuit 11-1 and the pump circuit 11-2 shown in FIG. 1.

A drain terminal of the NMOS transistor NT1 is connected to the input terminal IN, to which a drain terminal of the NMOS transistor NT2 is connected. A gate terminal of the NMOS transistor NT1 is connected to the output terminal OUT, to which a source terminal of the NMOS transistor NT2 and one electrode of the capacitor CM2 are connected. A source terminal of the NMOS transistor NT1 is connected to a node N11 to which a gate terminal of the NMOS transistor NT2 and one electrode of the capacitor CM1 are connected. In the pump circuit 11-1, a clock signal clock0 is input from the input terminal CLK1 that is connected to another electrode of the capacitor CM2, and a clock signal clock1 is input from the input terminal CLK2 that is connected to another electrode of the capacitor CM1. On the other hand, in the pump circuit 11-2, a clock signal clock2 is input from the input terminal CLK1 that is connected to the other electrode of the capacitor CM2, and a clock signal clock3 is input from the input terminal CLK2 that is connected to the other electrode of the capacitor CM1.

Figure 2B:
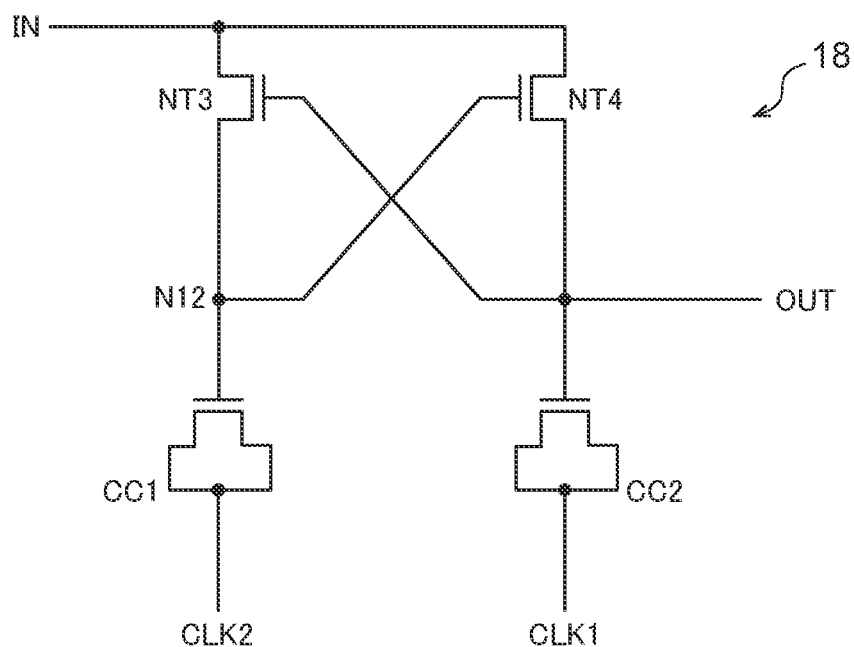
FIG. 2B is a circuit diagram of a pump circuit that uses a MOS capacitor according to the first exemplary embodiment.

As is shown in FIG. 2B, the pump circuit 18 according to the present exemplary embodiment includes NMOS transistors NT3 and NT4, and capacitors CC1 and CC2. The capacitors CC1 and CC2 are MOS capacitors. In other words, the capacitors CC1 and CC2 are configured by NMOS transistors whose drains and sources have been mutually connected together. Input terminals IN, CLK1, and CLK2, and an output terminal OUT correspond respectively to the input terminals IN, CLK1, and CLK2, and the output terminal OUT of the pump circuit 18 shown in FIG. 1. Since the circuit connections of the pump circuit 18 are the same as those of the pump circuit 11 shown in FIG. 2A, descriptions thereof are omitted. In the pump circuit 18, a clock signal clock0 is input from the input terminal CLK1 that is connected to another electrode of the capacitor CC2, and a clock signal clock1 is input from the input terminal CLK2 that is connected to another electrode of the capacitor CC1.

Figure 3:
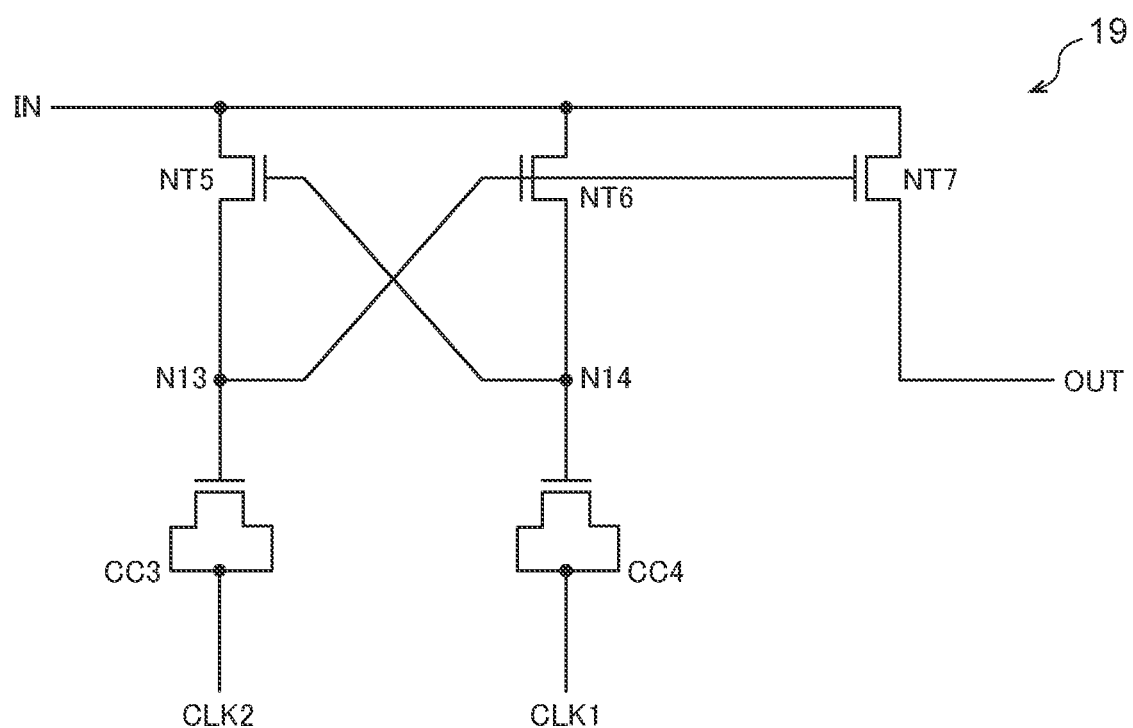
FIG. 3 is a circuit diagram of a final stage pump circuit according to the first exemplary embodiment.

As is shown in FIG. 3, the pump circuit 19 includes NMOS transistors NT5, NT6, and NT7, and capacitors CC3 and CC4. The capacitors CC3 and CC4 are MOS capacitors. In other words, the capacitors CC3 and CC4 are configured by NMOS transistors whose drain and source have been mutually connected together. Input terminals IN, CLK1, and CLK2, and an output terminal OUT respectively correspond to the input terminals IN, CLK1, and CLK2, and the output terminal OUT of the pump circuit 19 shown in FIG. 1. The pump circuit 19 is configured by adding the NMOS transistor N7 to the pump circuit 18 shown in FIG. 2B. NT7 is an NMOS transistor that is configured to prevent any backflow at the output stage, and prevents current from the output terminal VEP from flowing in the reverse direction (i.e., in the opposite direction from the load). In the pump circuit 19, a clock signal clock2 is input from the input terminal CLK1 that is connected to another electrode of the capacitor CC4, and a clock signal clock3 is input from the input terminal CLK2 that is connected to another electrode of the capacitor CC3.

Next, operations of the pump circuits will be described in more detail. The pump circuits 11-1, 11-2, 18, and 19 operate in accordance with clock signals input into each. However, since the fundamental operations of each circuit are the same, principally, the pump circuit 11 will be described as an example with reference to FIG. 2A.

In FIG. 2A, firstly, a case in which a potential VIN is applied to the input terminal IN, and the input terminal CLK1 is stopped in an L (=0V) state, while the input terminal CLK2 is stopped in an H (=Vd) state is considered. The potentials of the node N11 and the output terminal OUT are both VIN due to leaks from the NMOS transistor NT1 and the NMOS transistor NT2. Due thereto, electric charges in accordance with the potential difference VIN is accumulated in the capacitor CM2, and electric charges in accordance with the potential difference in a case in which Vd is subtracted from VIN (VIN−Vd) is accumulated in the capacitor CM1.

Next, in a case in which an H signal is applied to the input terminal CLK1 and an L signal is applied to the input terminal CLK2, then since the potential Vd is applied to the other terminal of the capacitor CM2, due to coupling, the potential of the output terminal OUT becomes (VIN+Vd). As a result, the NMOS transistor NT1 is turned ON, the potential of the node N11 becomes VIN, and the NMOS transistor NT2 is turned OFF. At this time, since the potential of the other electrode of the capacitor CM1 becomes L, charges in accordance with the potential difference VIN is accumulated in the capacitor CM1, while charges in accordance with the potential difference VIN remains accumulated in the capacitor CM2 as long as the current is not consumed in the output terminal OUT.

Furthermore, in a case in which an L signal is applied to the input terminal CLK1 and an H signal is applied to the input terminal CLK2, then, since the potential Vd is applied to the other electrode of the capacitor CM1, due to coupling, the node N11 becomes (VIN+Vd). As result of this, the NMOS transistor NT2 is turned ON, the potential of the output terminal OUT becomes VIN, and the NMOS transistor NT1 is turned OFF. At this time, charges in accordance with the potential difference VIN is accumulated in the capacitor CM2 as long as the current is not consumed in the output terminal OUT, while charges in accordance with the potential difference VIN remains accumulated in the capacitor CM1.

The pump circuits 18 and 19 for which a MOS capacitor is used also operate in the same way as the pump circuit 11. However, they differ from the pump circuit 11 in that, since the boosting capacitor is a MOS capacitor, in a case in which the threshold value of the NMOS transistor is NVT, then, charges accumulated in the capacitors CC1 and CC2, or in the capacitors CC3 and CC4 becomes charges in accordance with the potential difference (VIN−NVT). In the pump section 30, each of the pump circuits configuring the pump section 30 perform the above-described operation in sequence based on the clock signals clock0 to clock3, and boosting is performed by being successively transmitting the boosted potential.

Next, a boosting operation performed by the boost circuit 10 will be described with reference to FIG. 4 which shows waveforms of each section in the boosting operation. Firstly, an operation of each block shown in FIG. 1 is as follows. Namely, in FIG. 1, in the level shifter 27, in a case in which IN1 is H, the potential level of IN0 is output to OUT, and in a case in which IN1 is at L, L is output to OUT. In a case in which IN1 is H, the voltage divider 13 divides the potential level of IN0 and outputs the result to OUT, while in a case in which IN1 is L, L is output to OUT. In a case in which IN2 is H, the comparator 14 compares the potential levels of IN0 and IN1, and outputs the result of this determination to OUT. At this time, in a case in which the potential level of IN1 is higher than the potential level of IN0, L is output to OUT, while in a case in which the potential level of IN1 is lower than the potential level of IN0, H is output to OUT. In contrast, in a case in which IN2 is L, L is output to OUT. The clock generator 17 outputs a signal that is synchronized with the clock signal ckep input into IN to OUT0 and OUT3, and outputs an inverted signal of the clock signal ckep to OUT1 and OUT2.

In FIG. 1, in the boosting circuit inoperative mode, both the enable terminal EN and the clock input terminal CKEP are L. At this time, each one of the node N0, the node N3, the node N7, and the node N8 is L, and the node N1 and the node N2 are both H. Moreover, since both the PMOS transistor PT1 and the PMOS transistor PT2 are ON, the potential of the output terminal VEP becomes Vd. At this time, since the same potential level as that at the input terminal IN is output to the output terminal OUT in the pump circuits 11-1, 11-2, 18, and 19, the potentials of the node N4, the node N5, and the node N6 are all Vd. The waveform in the boosting circuit inoperative mode shows this state as far as the time t1 in the timing chart shown in FIG. 4.

In contrast, in the boosting circuit operative mode, H is applied to the enable terminal EN, and the clock signal ckep is input into the clock input terminal CKEP. At this time, the voltage divider 13 divides and outputs the potential of the output terminal VEP, and the comparator 14 compares the potential obtained from the division of the output terminal VEP with the reference potential Vref. Additionally, the PMOS transistor PT1 and the PMOS transistor PT2 are both turned OFF. Immediately after the enable terminal EN transitions from L to H, since the potential of the output terminal VEP is Vd and has not reached the desired potential level, the comparator 14 outputs H. As a result, the clock signal ckep is output to the node N8.

In a case in which the clock input terminal CKEP is H, the node N0 and the node N3 become H, the node N1 and the node N2 become L, and the node N4 and the node N5 both become 2VDD. In a case in which the clock input terminal CKEP transitions from this state to L, the potentials of the node N5 and the node N6 become 3VDD. In a case in which the clock input terminal CKEP transitions from this state to H, the potentials of the node N6 and the output terminal VEP become (4VDD−NVT). The waveform diagram of the boosting operation section in the boosting circuit operative mode shows this state from the time t1 as far as the time t2 in the timing chart shown in FIG. 4. In a case in which the potential of the output terminal VEP rises and reaches the desired potential, since the comparator 14 outputs L, the node N8 remains fixed at L irrespective of the level of the clock input terminal CKEP. This state is shown, in the timing chart shown in FIG. 4, in the waveform diagram at the boosting stopped portion, after the boosting circuit operative mode and after the time t2.

Figure 5:
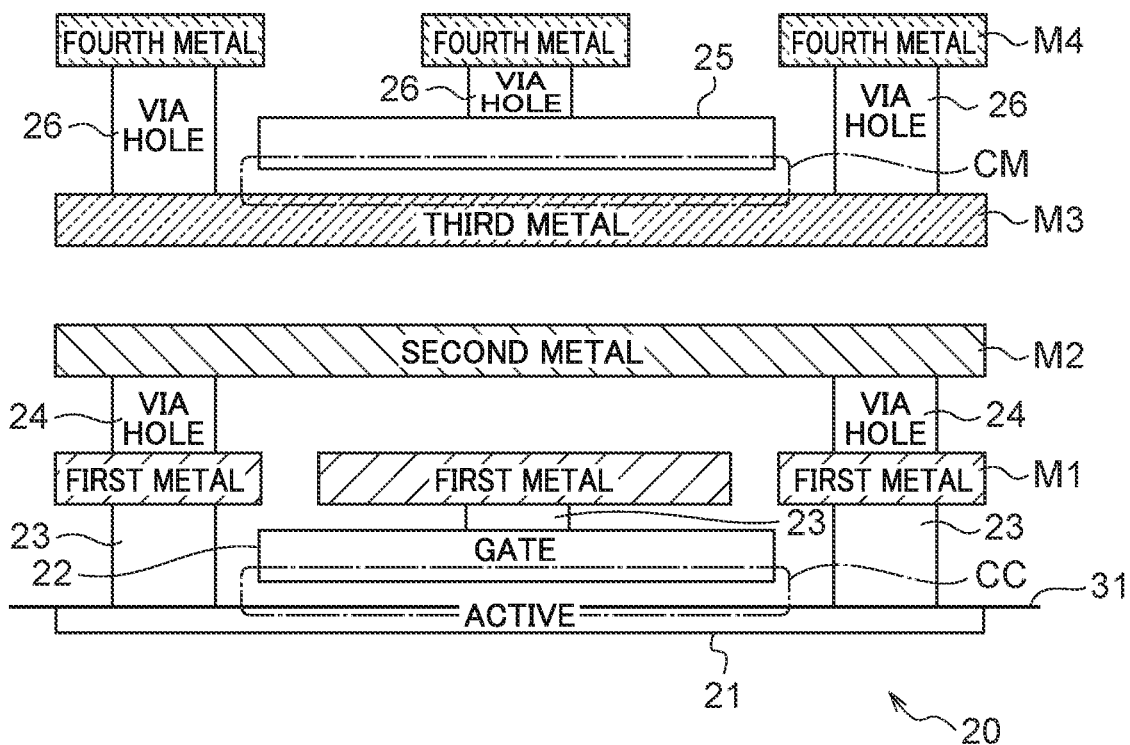
FIG. 5 is a cross-sectional view showing a layout in a vertical direction of the MIM capacitor and the MOS capacitor according to the first exemplary embodiment.

Next, a method of stacking a MIM capacitor and a MOS capacitor according to the present exemplary embodiment will be described with reference to FIG. 5. FIG. 5 is a vertical cross-sectional view of an area where the MIM capacitor CM and the MOS capacitor CC of the boosting circuit 10 are stacked. As is described above, in the boosting circuit 10 according to the present exemplary embodiment, in order to reduce the layout surface area, the MIM capacitor CM and the MOS capacitor CC are used together, and the MIM capacitor CM and the MOS capacitor CC are stacked in the stacking direction (i.e., the vertical direction) of the semiconductor device. In the present exemplary embodiment, as an example, a case is described in which four wiring layers are used. However, a different number of wiring layers may be used. Here, in sequence from the substrate, the four wiring layers are referred to as a 'first metal M1', a 'second metal M2', a 'third metal M3', and a 'fourth metal M4'.

The MOS capacitor CC is configured using the MOS transistor of the semiconductor device on which the boosting circuit 10 is mounted. As is shown in FIG. 5, both ends of an active area 21 that corresponds to the source and drain of the MOS transistor configured on a main surface 31 of a semiconductor device 20 are connected to a contact 23, and are short-circuited in the second metal M2 via the first metal M1 and via holes 24. In contrast, a gate 22 of the MOS transistor is connected to the first metal M1 via the contact 23. Namely, in the MOS capacitor CC, the gate 22 configures one electrode, while the active area 21 configures the other electrode. In addition, a capacitor dielectric body is disposed between the gate 22 and the active area 21, and, in the present exemplary embodiment, this dielectric body is formed using a gate oxide film. Note that, in the present exemplary embodiment, as an example, a case is described in which the electrodes on the active area 21 side are raised as far as the second metal M2 in order to connect the wiring. However, the present disclosure is not limited to this, and the wiring of both electrodes may be connected within the first metal M1.

In contrast, the MIM capacitor CM is configured using wiring layers for the electrodes and sandwiching a dielectric body between these. Namely, one electrode is configured in the third metal M3, and this electrode is connected to the fourth metal M4 via a via hole 26. Another electrode is configured by a capacitor metal 25 which is a different layer from the wiring layer, and this other electrode is connected to the metal M4 via a via hole. In the present exemplary embodiment, as an example, a silicon oxynitride film (an SiON film) is used as the dielectric body between the third metal M3 and the capacitor metal 25. Note that, in the present exemplary embodiment, a case in which the capacitor metal 25 is provided separately from the wiring layer is described as an example. However, the present disclosure is not limited to this, and a wiring layer, for example, the fourth metal M4 instead of the capacitor metal 25 may be used.

As described above, in the boosting circuit 10 according to the present exemplary embodiment, since the MIM capacitor CM and the MOS capacitor CC are disposed in a vertical stack, the surface area which corresponds to the area of the overlapping portion of the layout where the MIM capacitor CM and the MOS capacitor CC mutually overlap may be reduced. For example, in a case in which the surface area of the MIM capacitor CM and the surface area of the MOS capacitor CC on the layout are roughly the same, then the surface area of the layout may be halved.

Figure 6:
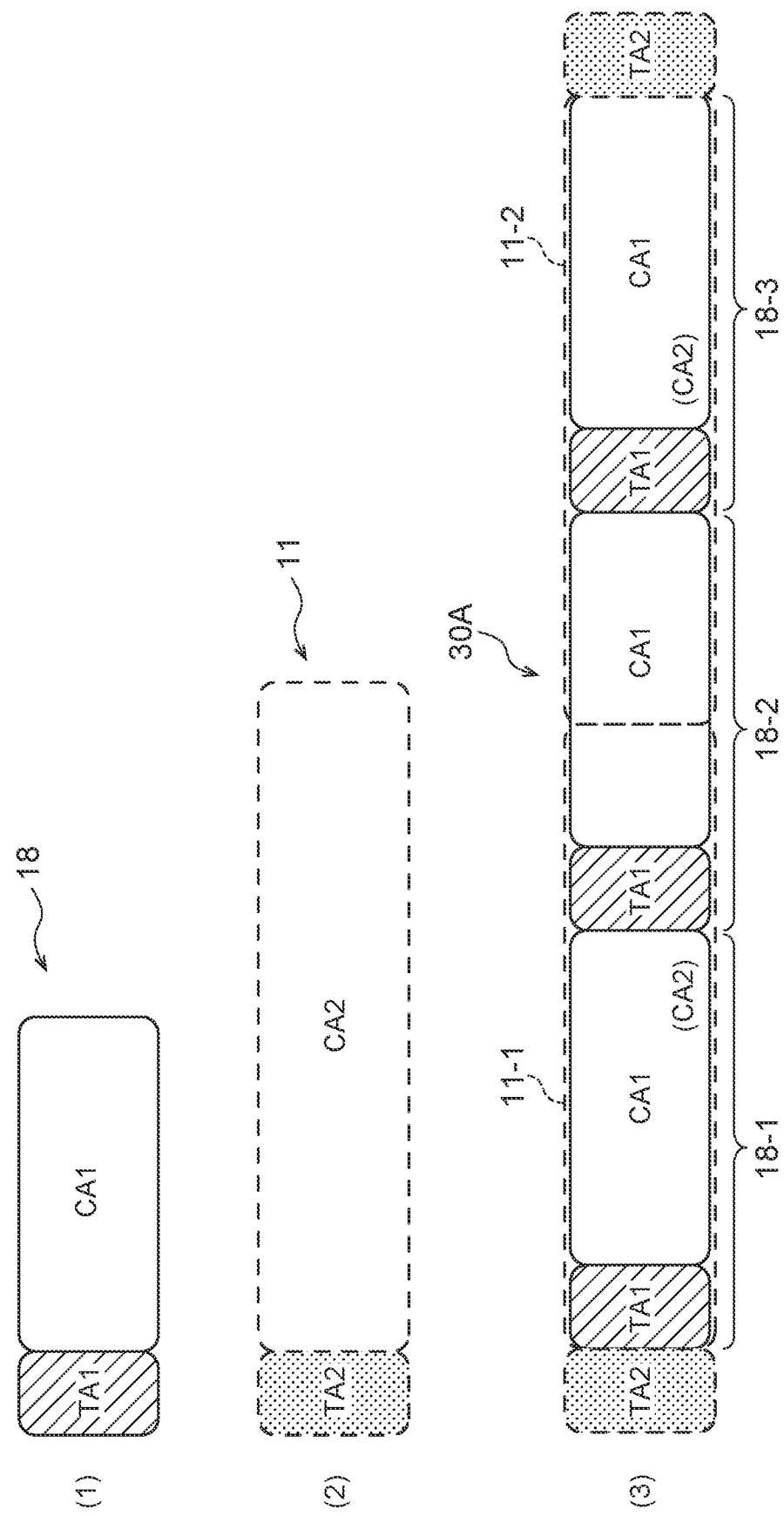
FIG. 6 is a layout diagram showing a planar arrangement of a pump section according to the first exemplary embodiment.

Next, an example of a layout of the boosting circuit 10 which includes the MIM capacitor CM and the MOS capacitor CC will be described with reference to FIG. 6. FIG. 6 is an example of a layout of a pump section 30A that is provided with five stages of pump circuits. In the pump section 30A, the first two pump circuits, including the initial pump circuit, are pump circuits that use MIM capacitors CM, while the remaining pump circuits, including the final pump circuit, are pump circuits that use MOS capacitors CC.

(1) of FIG. 6 shows an example layout of the pump circuit 18 (see FIG. 2B). In (1) of FIG. 6, the NMOS transistors NT3 and NT4 are disposed in a transistor area TA1, while the capacitors CC1 and CC2 are disposed in a capacitor area CA1. In other words, MOS capacitors CC are disposed in the capacitor area CA1. In contrast, (2) of FIG. 6 shows an example layout of the pump circuit 11 (see FIG. 2A). In (2) of FIG. 6, the NMOS transistors NT1 and NT2 are disposed in a transistor area TA2, while the capacitors CM1 and CM2 are disposed in a capacitor area CA2. In other words, MIM capacitors CM are disposed in the capacitor area CA2.

(3) of FIG. 6 shows a layout of the entire pump section 30A in which (1) and (2) are combined. In the layout example of (3) of FIG. 6, pump circuits 18-1, 18-2, and 18-3, which are pump circuits 18, are arranged in a horizontal row, and on top of these, pump circuits 11-1, and 11-2, which are pump circuits 11, are superimposed. Note that, the pump circuit 11-2 is left-right inverted. As is shown in (3) of FIG. 6, it is not possible for the transistor areas TA1 and TA2 to be superimposed, however, the capacitor area CA2 can be superimposed on the transistor area TA1 and the capacitor area CA1.

As described above, according to the boosting circuit 10 of the present exemplary embodiment in which the above-described layout method is employed, or in a semiconductor device in which this boosting circuit 10 is mounted, layout surface area may be greatly reduced.

Second Exemplary Embodiment

A boosting circuit according to the present exemplary embodiment will now be described with reference to FIG. 7. In the present exemplary embodiment, a case in which shield wiring is disposed between the MIM capacitor CM and the MOS capacitor CC in the above-described boosting circuit 10, will be described. Accordingly, since the configurations of the boosting circuit and the pump circuits are the same as in the above-described boosting circuit 10, a description thereof is omitted.

Figure 7:
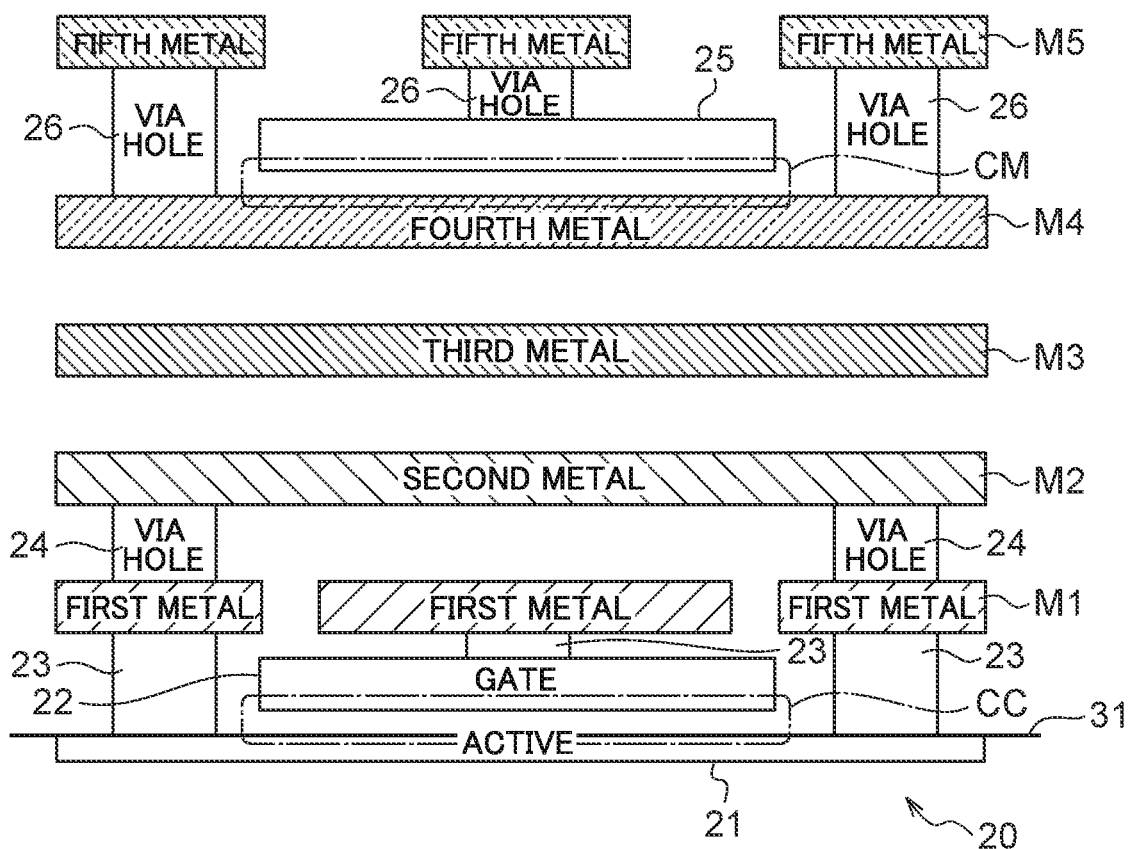
FIG. 7 is a cross-sectional view showing a layout in a vertical direction of a MIM capacitor and a MOS capacitor according to a second exemplary embodiment.

As is shown in FIG. 7, in the boosting circuit according to the present exemplary embodiment, five wiring layers provided with the first metal M1 through the fifth metal M5 are used. The portion of the MOS capacitor CC includes the first metal M1 and the second metal M2 is the same as is shown in FIG. 5. In addition, the portion of the MIM capacitor CM that includes the fourth metal M4 and the fifth metal M5 is configured such that, the third metal M3 and the fourth metal M4 shown in FIG. 5 corresponds to the fourth metal M4 and the fifth metal M5, respectively. Fundamentally, the configuration is the same as the MIM capacitor CM shown in FIG. 5.

As is shown in FIG. 7, in the present exemplary embodiment, the third metal M3 is used to provide shield wiring between the MIM capacitor CM and the MOS capacitor CC.

By this shield wiring, interference between the MIM capacitor CM and the MOS capacitor CC may be suppressed in a case in which the boosting circuit is in operation. Since distortion of the waveform is also suppressed in a case in which interference between the MIM capacitor CM and the MOS capacitor CC is suppressed, any deterioration in the boosting efficiency may also be suppressed. This shield wiring is particularly effective in a case in which the MIM capacitor CM and the MOS capacitor CC are disposed at mutually close positions. By providing this shield wiring, it becomes possible to dispose the MOS capacitor CC as the layer underneath the MIM capacitor CM, and at the same time, interference may be suppressed. Thus, the present exemplary embodiment may effectively reduce the layout surface area of the boosting circuit or of a semiconductor device incorporating the boosting circuit, and may suppress deterioration in the boosting efficiency.

Here, in the present exemplary embodiment, a case in which one layer of shield wiring is provided has been described. However, the present disclosure is not limited to this, and many layers as necessary may be provided. For example, two layers of shield wiring may be provided by disposing one layer of shield wiring as the layer underneath the MIM capacitor CM, and one layer of shield wiring as the layer above the MOS capacitor CC.

Note that, in the above-described exemplary embodiments, a case in which the boosting capacitors used in the pump circuits are vertically stacked has been described. However, the present disclosure is not limited to this and other capacitors inside a semiconductor device may be vertically stacked on each other. For example, by-pass condensers for each function block within a semiconductor device may be apportioned to a MIM capacitor and a MOS capacitor, and both of these may be vertically stacked.

Moreover, in the above-described exemplary embodiment, a case in which a MIM capacitor is configured by a wiring layer which is the topmost layer (i.e., a top metal), and by a wiring layer there below, has been described. However, the present disclosure is not limited to this, and both electrodes may be formed by using internal wiring layers without using the top metal.

Moreover, in the above-described exemplary embodiments, a case in which a MIM capacitor and a MOS capacitor are used as boosting capacitors, has been described. However, the present disclosure is not limited to this, and another type of capacitor may be used. For example, a MOM (Metal Oxide Metal) capacitor may be used instead of a MIM capacitor, and the MOM capacitor and MOS capacitor may be vertically stacked.

Furthermore, in the above-described exemplary embodiments, a case in which the present disclosure is applied to the boosting circuit 10 shown in FIG. 1 has been described. However, another type of boosting circuit may be applied as the boosting circuit 10. In the same way, in the above-described exemplary embodiments, a case in which the present disclosure is applied to the pump circuits shown in FIG. 2 and FIG. 3, has been described. However, the pump circuits shown in FIG. 2 and FIG. 3 are examples, another type of pump circuit may be applied in the present disclosure.

What is claimed is:

1. A semiconductor device comprising:
a semiconductor substrate;
a plurality of circuit blocks each provided on a main surface of the semiconductor substrate and each having a predetermined function;
a wiring layer including a plurality of metal layers that are stacked on the main surface of the semiconductor substrate; and
a plurality of capacitors including first capacitors comprising the plurality of metal layers, and second capacitors comprising an active area disposed within the main surface of the semiconductor substrate,
wherein at least one of the first capacitors and at least one of the second capacitors are stacked in a stacking direction of the plurality of metal layers.

2. The semiconductor device according to claim 1, wherein a dielectric body configuring the first capacitors comprises a silicon oxynitride film.

3. The semiconductor device according to claim 1, wherein:
each one of the circuit blocks is a boosting circuit that includes capacitors from among the first capacitors or capacitors from among the second capacitors, the boosting circuits being connected in series and successively boosting a voltage input thereto;
from among the boosting circuits connected in series, a boosting circuit at an initial stage and a predetermined number of the boosting circuits include first capacitors from among the first capacitors; and
from among the boosting circuits connected in series, remaining boosting circuits other than the boosting circuit at the initial stage and the predetermined number of the boosting circuits include second capacitors from among the second capacitors.

4. The semiconductor device according to claim 3, wherein:
each of the plurality of boosting circuits includes a MOS transistor that controls charges that flow into the first capacitors or the second capacitors; and
the second capacitors comprise a MOS transistor having a gate oxide film as a dielectric body.

5. The semiconductor device according to claim 4, wherein the second capacitors and the MOS transistor that controls charges are disposed in a same layer.

6. The semiconductor device according to claim 1, wherein the first capacitors are MIM capacitors or MOM capacitors.

7. The semiconductor device according to claim 1, further comprising at least one shielding layer, provided between the first capacitors and the second capacitors, that shields the first capacitors and the second capacitors from each other.

* * * * *